United States Patent [19]

Wakata et al.

[11] Patent Number: 5,663,212
[45] Date of Patent: Sep. 2, 1997

[54] LIGHT-SENSITIVE RESIN COMPOSITION

[75] Inventors: Yuichi Wakata; Morimasa Sato; Ken Iwakura; Yuuichi Fukushige, all of Shizuoka, Japan

[73] Assignee: Fuji Photo Film Co., Ltd., Kanagawa, Japan

[21] Appl. No.: 191,927

[22] Filed: Feb. 4, 1994

[30] Foreign Application Priority Data

Feb. 5, 1993 [JP] Japan ................... 5-018947
Sep. 3, 1993 [JP] Japan ................... 5-220151

[51] Int. Cl.$^6$ ............... C08K 5/00; C08J 3/28; G03C 1/73; G03F 7/00
[52] U.S. Cl. ............. 522/75; 430/281.1; 430/910; 522/78; 522/79; 522/114; 522/120; 522/121; 522/907; 522/144
[58] Field of Search ............... 430/281, 281.1, 430/910; 522/75, 78, 114, 144, 79, 120, 121, 907

[56] References Cited

U.S. PATENT DOCUMENTS

| | | | |
|---|---|---|---|
| 4,179,548 | 12/1979 | Schroeter et al. | 525/329 |
| 4,272,609 | 6/1981 | Klüpfel | 430/281 |
| 4,291,113 | 9/1981 | Minamizono et al. | 430/202 |
| 4,544,691 | 10/1985 | Dexter et al. | 524/99 |
| 4,618,638 | 10/1986 | Dexter et al. | 524/208 |
| 5,114,832 | 5/1992 | Zerani et al. | 430/285 |
| 5,141,990 | 8/1992 | McKoy et al. | 522/4 |
| 5,185,445 | 2/1993 | Meuwly et al. | 544/216 |
| 5,215,876 | 6/1993 | Pruett et al. | 430/512 |
| 5,356,755 | 10/1994 | Matsuda et al. | 430/313 |
| 5,364,741 | 11/1994 | Huynh-Tran et al. | 430/284 |

FOREIGN PATENT DOCUMENTS

| | | | |
|---|---|---|---|
| 60-140344 | 7/1985 | Japan | G03C 7/26 |
| 93/05443 | 3/1993 | WIPO | G03C 1/815 |

Primary Examiner—George F. Lesmes
Assistant Examiner—Steven H. Versteeg
Attorney, Agent, or Firm—Sughrue, Mion, Zinn, Macpeak & Seas

[57] ABSTRACT

A light-sensitive resin composition which can be developed in an alkaline aqueous solution and has an excellent image-forming performance and a sufficient UV absorbance after an image formation is disclosed. The light-sensitive resin composition includes (1) a photopolymerization initiator or a photopolymerization initiator system, (2) an addition-polymerizable monomer having an ethylenically unsaturated double bond, (3) a high molecular binder which is soluble in an alkaline aqueous solution and insoluble in water, and (4) at least one of the compounds which substantially do not absorb light in a specified UV region and which, when subjected to treatment with an aqueous alkali solution and/or to heating, are capable of absorbing light in that region and have substantially no absorption in the visible region.

8 Claims, No Drawings

LIGHT-SENSITIVE RESIN COMPOSITION

FIELD OF THE INVENTION

The present invention relates to a light-sensitive resin composition capable of being developed in an alkali aqueous solution, more specifically to a light-sensitive resin composition having an excellent image-forming performance and a high UV absorbance after forming the image, and an image-forming process using this.

BACKGROUND OF THE INVENTION

An image formation with a light-sensitive resin composition is used in a wide field such as a printing wiring plate, a printing plate, IC circuit, and a preparation of a color proof, and various processes are available according to the applications and forms thereof. In every case, it generally includes a process for providing a light-sensitive resin layer on a substrate, a process for imagewise irradiating a ray (hereinafter referred to as a pattern exposure), and a developing process. Of these processes, a representative one used as a developing solution in the developing process is roughly classified to an organic solvent series, an alkaline aqueous solution, and a water series. In recent years, it is going toward a light-sensitive resin composition capable of being developed in the alkaline aqueous solution or water from a viewpoint of a working environment, an air pollution and a water contamination.

UV radiation is most generally used for a pattern exposure of these light-sensitive resin compositions. That requires a sufficient image-forming performance with UV radiation to the light-sensitive resin composition, and various initiators which absorb the UV radiation to start a reaction are known. Too large UV absorbance of the light-sensitive resin composition prevents a sufficient amount of the UV radiation from reaching a bottom of the composition and accordingly generates a defect such as a reduction of a sensitivity and cutting off at a lower part (a portion close to a substrate) of a relief image. Accordingly, the UV absorbance of the light-sensitive resin composition can not simply be increased.

On the other hand, a sufficient UV absorbance is required to an image itself formed in some cases from a viewpoint of a light fastness and for a purpose of providing a back face exposure aptitude in which a formed image is used as a light-shielding pattern, a so-called self-alignment system. An addition of a so-called UV absorber is effective to meet the purpose of absorbing UV radiation. Such the example is described in, for example, JP-A-5-210009 (the term "JP-A" as used herein means an unexamined published Japanese patent application) and Japanese Patent Application No. 4-150691. However, an addition of the UV absorber in such an amount as capable of providing a light-sensitive resin composition with a sufficient UV absorbance causes UV radiation necessary for forming an image in a pattern exposure to be absorbed as well, and accordingly the problems such as a reduction of a sensitivity and cutting off at a lower part (a portion close to a substrate) of a relief image are generated.

For a purpose of solving these problems, there is described in, for example, JP-A-4-278901, a process in which for a purpose of providing UV radiation exposure aptitude passing through a formed image, an exposure is carried out via a specific filter which does not transmit a portion of an image already formed and allows only a light-sensitive wavelength for a light-sensitive layer which is to be newly exposed to transmit. However, there are involved in this system, the problems that the respective light-sensitive layers have to be set at the different light-sensitive wavelengths and that a specific filter has to be provided according to the compositions of the light-sensitive layers.

There is disclosed in, for example, JP-A-4-214530, an image forming process in which baking is carried out at 150° to 300° C. after forming an image with a photoresist to increase an absorbance of UV radiation and this is used as a light-shielding pattern.

Specifically, a positive working photoresist having an image formed therein is baked, a black resist is applied on the baked photoresist and dried, then the photoresist is exposed to light from the back side and developed, and then the positive working photoresist is puled off to provide a black image. The above process can certainly omit the use of a mask for exposure in the formation of a black image. However, when an RGB image with a black matrix such as a color filter for use, for example, in liquid crystal displays, it is difficult to form first an RGB image and then a black matrix. Further, in this composition, an increase in an absorbance after baking is extended to a long wavelength region (vicinity of 400 to 700 nm) and accordingly, a defect that an image completed has an inferior color tone is involved.

Thus, there is not known in an alkali developing type light-sensitive resin composition, a composition which has an excellent image forming performance in exposing and a sufficient UV absorbance after forming the image and which provides the image with a satisfactory color tone and enables to form the image without changing a usual process.

A number of compounds are known as UV absorbers. Typical such compounds are those having at least one hydroxyl group in the molecule. Typical examples of these compounds include 2-(2'-hydroxyphenyl)2H-benzotriazole derivatives and p-hydroxycyano-cinnamic acid derivatives. Other compounds such as 2-hydroxybenzophenone derivatives and salicylic acid aryl ester derivatives are also known as UV absorbers. Also, the compounds resulting from protecting at least one hydroxyl group (OH group) in these derivatives by a protective group or from converting it into a derived group (OR group) are known UV absorbers.

Examples of the compounds resulting from protecting at least one hydroxyl group (OH group) of 2-(2'-hydroxyphenyl)2H-benzotriazole derivatives by a protective group or from converting it into a derived group (OR group) are described in U.S. Pat. No. 3,936,418 containing as R an aryloxycarbonyl group; European Patent 180548 an acyl group, an alkyloxycarbonyl group or an acylcarbonyl group; U.S. Pat. No. 4,260,768 an acryloyl group; and JP-A-57-45169 an acetyl group; U.S. Pat. No. 4,041,011 disclosing a compound made in the bis form through a linking chain and an acyl group using a dicarboxylic acid; U.S. Pat. No. 3,936,418 disclosing a 2-(2'-hydroxyphenyl)2H-benzotriazole derivative with an acetyl group as R and also a formyl group.

Also, JP-A-58-38269 discloses compounds with an acyl group as R and containing a vinyl group; JP-A-57-45169 compounds with an acetyl group as R and a polymerizable group and polymeric compounds derived from these compounds.

Examples of compounds resulting from protecting a hydroxyl group (OH group) of p-hydroxycyanocinnamic acid by a protective group or from converting it into a derived group (OR group) are those described in JP-A-5-100417 including compounds having an alkoxycarbonylmethyl group as R and a polymerizable unsaturated double bond in a cinnamic ester moiety.

There are also many other known UV absorbing compounds such as 2-hydroxybenzophenone derivatives and salycilic acid aryl ester derivatives with at least one hydroxyl group (OH group) protected by a protective group or a derived group (OR group).

The compound itself obtained by protecting these hydroxy groups (OH groups) with any protective groups or converting them to derived groups (OR groups) also is a kind of a UV absorber. In fact, in the examples described above, these compounds are used as the UV absorber in many cases. However, the absorption wavelength region thereof is usually shifted to a short wavelength region as compared with the case of a hydroxy group, and a sufficient UV absorbance is not provided in an exposing wavelength (in and about 330 to 430 nm) usually used for forming an image with a photoresist. On the contrary, it is considered that if these compounds could be converted to a hydroxy product in any form, there could be provided a lower absorbance of UV radiation used for forming an image in exposing and a sufficient UV absorbance after forming the image.

There are described in, for example, U.S. Pat. No. 4,328,346, and JP-A-57-57772, 62-209087, 63-132978, and 1-258689 as an example in which such conversion is carried out, the examples of a photocurable coating composition in which a derivative of 2-(2'-hydroxy-phenyl)2H-benzotriazole in which at least one hydroxy group having a silane functional group is protected with a benzoyl group or a benzenrsulfonyl group is used as a precursor (it has a low UV absorbance in a light-sensitive wavelength region in itself but it is converted to a UV absorber in the light-sensitive wavelength region by a reaction and a processing thereafter) of a benzotriazole series UV absorber to convert it to a UV absorber utilizing a photo Fries rearrangement. However, the example of using them for forming an image in a process such as a development is not described in the publications described above. The similar reaction is described as well in Journal of Applied Polymer Science 28 1159 (1983) but an image formation by a process such as a development is not described as well.

The phenylbenzotriazole series compounds in which a hydroxy group is protected with a urethane bond are described in U.S. Pat. Nos. 4,061,652 and 4,179,548, and JP-A-52-68158, and it is described therein that it is used as a precursor of a UV absorber for a UV-curable resin. In these examples, splitting off is made by heating after curing with UV radiation. However, an example in which they are used for an image formation in a process such as a development is not described as well in this example.

Further, there is disclosed in U.S. Pat. No. 5,141,990, the example in which a compound obtained by protecting at least one hydroxy group of a derivative of a 2-(2'-hydroxyphenyl)2H-benzotriazole with a saturated acyl group or an acryloyl group is used as a precursor of a UV absorber to convert it to a UV absorber by a development. However, the development described herein corresponds to an after-exposure after curing with UV radiation and is an exposure further continued after wholly curing a UV-curing type coating material. Accordingly, it is not aimed at an image formation.

The examples of using these compounds, in which R is an acyl group, for an image-forming material are described in JP-A-64-23257, 64-19342, 64-9457, 64-7038, 64-7040, 64-9454, 64-13147, 2-77060, and 3-61946. However, all of them are used for a purpose of improving an image storing performance of a silver halide photographic light-sensitive material. Accordingly, an exposing wavelength resides in the visible region, and the form thereof is different from a purpose that light of an exposing wavelength (in the range of about 330 to about 430 nm) which is used for an image formation in a conventional photoresist is not absorbed in exposing.

Also, it is not described that the compounds resulting from protecting at least one hydroxyl group (OH group) of p-hydroxycyanocinnamic acid derivatives with a protective group or from converting it into a derived group (OR group) are used as precursors of UV absorbers and thereafter converted into p-hydroxycyanocinnamic acid derivatives. There is also no disclosure relating to alkali developing type photoresists such as those relating to the present invention.

SUMMARY OF THE INVENTION

Therefore, an object of the present invention is to provide a light-sensitive resin composition which can be developed in an alkaline aqueous solution and has a sufficient image-forming ability in a pattern exposure and a sufficient UV absorbing performance after an image formation and which has no problem on a color tone of an image obtained and can form the image without changing a usual process.

The second object of the present invention is to provide an image-forming process using the light-sensitive resin composition described above.

The extensive efforts made by the present inventors have resulted in finding the following and completing the present invention: that is, the objects of the present invention can be achieved by a light-sensitive resin composition containing:

(1) a photopolymerization initiator or a photopolymerization initiator system, (2) an addition-polymerizable monomer having an ethylenically unsaturated double bond, (3) a high molecular binder which is soluble in an alkaline aqueous solution and insoluble in water, and (4) at least one of the compounds which substantially do not absorb light in about 280–450 nm region and which, when subjected to treatment with an aqueous alkali solution and/or to heating, are capable of absorbing light in said region and have substantially no absorption in the visible region.

DETAILED DESCRIPTION OF THE INVENTION

A coloring material is incorporated into these compositions to enable to form an image having one or more colors.

Further, these compositions are used and a development in an alkaline aqueous solution and further an after-heating according necessity are carried out after imagewise irradiating with UV radiation, whereby an aimed image having a sufficient UV absorbance can be formed without reducing an image forming ability.

Further, an image can be formed by the following image forming process; that is, in the case where at least one image described above is formed on a transparent substrate, the second layer comprising another light-sensitive resin composition is further provided on this image and an overall or partial exposure is given from a side of the transparent substrate, on which the above image is not formed; in the case where the overall exposure is given, the second layer part provided on the image previously formed is subjected to a development and removal, and in the case where the partial exposure is given, the second layer part provided on the image previously formed and an unexposed part (a part which is substantially not sensitized) are subjected to the development and removal, that is, a so-called self-alignment exposing process.

The present invention will be explained below in more detail.

All known photopolymerization initiators or photopolymerization initiator series can be used for the photopolymerization initiator or photopolymerization initiator series used in the present invention. The examples thereof include 6-(p-methoxyphenyl)-2,4-bis(trichloromethyl)-s-triazine, 6-[p-(N,N-bis(ethoxy-carbonylmethyl)amino)phenyl]-2,4-bis(trichloromethyl)-s-triazine, 2-(p-butoxystyryl)-5-trichloromethyl-1,3,4-oxadiazole, 9-phenylacridine, 9,10-dimethylbenzophenazine, Michler's ketone, benzophenone/Michler's ketone, hexaarylbiimidazole/mercaptobenzimidazole, benzyl-dimethylketal, thioxanthone/amine, and 2-(o-chloro-phenyl)-4,5-diphenylimidazole dimer. Particularly preferred are trihalomethyl group-containing compounds such as 6-[p-(N,N-bis(ethoxycarbonylmethyl)amino)-phenyl ]-2 ,4-bis (trichloromethyl)-s-triazine and 2-(p-butoxystyryl)-5-trichloromethyl-1,3,4-oxadiazole, Michler's ketone, and 2-(o-chlorophenyl)-4,5-diphenylimidazole dimer. These photopolymerization initiators may be used singly or as a mixture of two or more kinds. An addition amount of the photopolymerization initiator is 0.1 to 20 weight %, particularly preferably 0.5 to 10 weight % based on the weight of the whole solid matters. The addition amount less than 0.1 weight % reduces an efficiency of photocuring of the composition and therefore requires a long time for an exposure, and that exceeding 20 weight % is liable to cause a lower part of an image formed to be cut off and is unsuitable.

The following compounds can be used singly or in combination with the other monomers as the addition-polymerizable monomer having an ethylenically unsaturated double bond used in the present invention. Specifically, they include t-butyl (metha)acrylate, ethylene glycol di(metha) acrylate, 2-hydroxypropyl (metha)acrylate, triethylene glycol di(metha)acrylate, trimethylolpropane tri(metha) acrylate, 2-ethyl-2-butylpropanediol di(metha)acrylate, pentaerythritol tri(metha)acrylate, pentaerythritol tetra (metha)-acrylate, dipentaerythritol hexa(metha)acrylate, dipentaerythritol penta(metha)acrylate, polyoxyethylatedtrimethylolpropane tri(metha)acrylate, tris(2-(metha)-acryloyloxyethyl)isocyanurate, 1,4-diisopropenyl-benzene, 1,4-dihydroxybenzene (metha)acrylate, decamethylene glycol di(metha)acrylate, styrene, diallyl fumarate, triallyl trimellitate, lauryl (metha)acrylate, (metha)acrylamide, and xylenebis(metha)acrylamide. Furthert, there can be used a reaction product of a compound having a hydroxyl group, such as 2-hydroxyethyl (metha)acrylate, 2-hydroxypropyl (metha)acrylate, and polyethylene glycol mono(metha) acrylate with diisocyanate such as hexamethylenediisocyanate, toluenediisocyanate, and xylenediisocyanate. Of them, particularly preferred are pentaerythritol tetra-acrylate, dipentaerythritol hexaacrylate, dipenta-erythritol pentaacrylate, and tris(2-acyloyloxyethyl)-isocyanurate.

The whole amount of the monomers contained in a photopolymerizable composition is 5 to 80 weight %, particularly preferably 10 to 70 weight % based on the whole components of the composition. The amount less than 5 weight % deteriorates a durability to an alkali developing solution at an exposed part of the composition, and that exceeding 80 weight % increases tackiness of a light-sensitive layer deteriorates a handling performance.

There can be enumerated as the high molecular binder used in the present invention, which is soluble in an alkaline aqueous solution and insoluble in water, for example, a homopolymer of a polymerizable compound having one or more acid groups and one or more polymerizable unsaturated bonds in a molecule or a copolymer of two or more kinds thereof, and a copolymer of one or more polymerizable compounds having one or more unsaturated bonds copolymerizable with these compounds and containing no acid group, therewith. Such compounds can be obtained by copolymerizing one or more kinds of a low molecular compound having one or more acid groups and one or more polymerizable unsaturated bonds in a molecule with one or more polymerizable compounds having one or more unsaturated bonds copolymerizable with these compounds and containing no acid group. There can be enumerated as an example of the acid group, a —COOH group, a —SO$_3$H group, a —SO$_2$NHCO— group, a phenolic hydroxy group, a —SO$_2$NH— group, and a —CO—NH—CO— group. Of them, a high molecular compound having a —COOH group is particularly preferably used.

Examples of polymerizable compounds having one or more acid group and one or more polymerizable unsaturated bond in a molecule include the following compounds.

Acrylic acid, methacrylic acid, itaconic acid, crotonic acid, maleic acid, vinylbenzoic acid, and cinnamic acid are examples of the polymerizable compounds having one or more —COOH groups and one or more polymerizable unsaturated bonds in a molecule.

Vinylbenzenesulfonic acid and 2-(metha)-acrylamide-2-methylpropanesulfonic acid are examples of the polymerizable compounds having one or more —SO$_3$H groups and one or more polymerizable unsaturated bonds.

N-methylsulfonyl (metha)acrylamide, N-ethylsulfonyl (metha)acrylamide, N-phenylsulfonyl (metha)acrylamide, and N-(p-methylphenylsulfonyl) (metha)acrylamide are examples of the polymerizable compounds having one or more —SO$_2$NHCO— groups and one or more polymerizable unsaturated bonds.

Examples of polymerizable compounds having one or more phenolic hydroxy groups and one or more polymerizable unsaturated bonds in a molecule include hydroxyphenyl (metha)acrylamide, dihydroxyphenyl (metha) acrylamide, hydroxyphenyl-carbonyloxyethyl (metha) acrylate, hydroxyphenyloxyethyl (metha)acrylate, hydroxyphenylthioethyl (metha)acrylate, dihydroxyphenylcarbonyloxyethyl (metha)acrylate, dihydroxyphenyloxyethyl (metha)acrylate, and dihydroxy-phenylthioethyl (metha)acrylate.

Examples of the polymerizable compound having one or more —SO$_2$NH— groups and one or more polymerizable unsaturated bonds in a molecule include a compound represented by Formula (a) or (b):

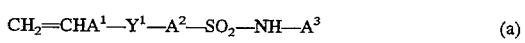 (a)

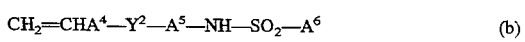 (b)

wherein Y$^1$ and Y$^2$ each represents —COO—, —CONA$^7$—, or a single bond; A$^1$ and A$^4$ each represents H or CH$_3$; A$^2$ and A$^5$ each represents C$_1$ to C$_{12}$ alkylene which may have a substituent, cycloalkylene, arylene, or aralkylene, or C$_2$ to C$_{12}$ alkylene into which an ether group and a thioether group are inserted, cycloalkylene, arylene, or aralkylene; A$^3$ and A$^6$ each represents H, a C$_1$ to C$_{12}$ alkyl group which may have a substituent, a cycloalkyl group, an aryl group, or an aralkyl group; and $A^7$ represents H, a $C_1$ to $C_{12}$ alkyl group which may have a substituent, a cycloalkyl group, an aryl group, or an aralkyl group.

The polymerizable compounds having one or more —CO—NH—CO— groups and one or more polymerizable unsaturated bonds include maleimide and N-acryloyl-acrylamide. These polymerizable compounds become the high molecular compounds a —CO—NH—CO— group, in which a ring is formed together with a primary chain by polymerization. Further, a methacrylic acid derivative and an acrylic acid derivative each having a —CO—NH—CO group can be used as well. Such methacrylic acid derivatives and the acrylic acid derivatives include, for example, a methacrylamide derivative such as N-acetylmethacrylamide, N-propionylmethacrylamide, N-butanoylmethacrylamide, N-pentanoylmethacrylamide, N-decanoylmethacrylamide, N-dodecanoylmethacrylamide, N-benzoylmethacrylamide, N-(p-methylbenzoyl)methacrylamide, N-(p-chlorobenzoyl)methacrylamide, N-(naphthyl-carbonyl)methacrylamide, N-(phenylacetyl)-methacrylamide, and 4-methacryloylaminophthalimide, and an acrylamide derivative having the same substituent as these. These polymerizable compounds polymerize to be high molecular compounds having a —CO—NH—CO— group in a side chain.

Examples of polymerizable compounds having one or more polymerizable unsaturated bonds and containing no acid group include a compound having a polymerizable unsaturated bond, selected from (metha)acrylates, (metha)acrylamides, an acrylic compound, vinyl ethers, vinyl esters, styrenes, and crotonates, and specifically, include (metha)-acrylates such as alkyl (metha) acrylate or substituted alkyl (metha)acrylate (for example, methyl (metha)acrylate, ethyl (metha)acrylate, propyl (metha)-acrylate, isopropyl (metha) acrylate, butyl (metha)-acrylate, amyl (metha)acrylate, hexyl (metha)acrylate, cyclohexyl (metha)acrylate, ethyl-hexyl (metha)acrylate, octyl (metha)acrylate, t-octyl (metha) acrylate, chloro-ethyl (metha)acrylate, allyl (metha)acrylate, 2-hydroxy-ethyl (metha)acrylate, 2-hydroxypropyl (metha)-acrylate, 4-hydroxybutyl (metha) acrylate, 2,2-dimethyl-3-hydroxy-propyl (metha) acrylate, 5-hydroxypentyl (metha) acrylate, trimethylolpropane mono (metha)acrylate, pentaerythritol mono (metha)acrylate, benzyl (metha)acrylate, methoxy-benzyl (metha)acrylate, chlorobenzyl (metha) acrylate, furfuryl (metha)acrylate, tetrahydrofurfuryl (metha)-acrylate, and phenoxyethyl (metha)acrylate), and aryl (metha)acrylate (for example, phenyl (metha)acrylate, cresyl (metha)acrylate, and naphthyl (metha)acrylate);

(metha)acrylamides such as (metha)acryl-amide, N-alkyl (metha)acrylamide (the alkyl group includes, for example, methyl, ethyl, propyl, butyl, t-butyl, heptyl, octyl, ethylhexyl, cyclohexyl, hydroxy-ethyl, and benzyl), N-aryl (metha)acrylamide (the aryl group includes, for example, phenyl, tolyl, nitrophenyl, naphthyl, and hydroxyphenyl), N,N-dialkyl(metha)acryl-amide (the alkyl group includes, for example, methyl, ethyl, butyl, isobutyl, ethylhexyl, and cyclohexyl), N,N-diaryl (metha) acrylamide (the aryl group includes, for example, phenyl), N-methyl-N-phenyl (metha) acryl-amide, N-hydroxyethyl-N-methyl (metha) acrylamide, N-2-acetoamidethyl-N-acetyl(metha)acrylamide, N-(phenyl-sulfonyl)(metha)acrylamide, and N-(p-methylphenyl-sulfonyl)(metha)acrylamide;

an allyl compound such as allyl esters (for example, allyl acetate, allyl caproate, allyl caprylate, allyl laurate, allyl palmitete, allyl stearate, allyl benzoate, allyl acetoacetate, and allyl lactate), and allyloxyethanol;

vinyl ethers such as alkyl vinyl ether (the alkyl group includes, for example, hexyl, octyl, decyl, ethylhexyl, methoxyethyl, ethoxyethyl, chloroethyl, 1-methyl-2,2-dimethylpropyl, 2-ethylbutyl, hydroxyethyl, hydroxyethoxyethyl, dimethylaminoethyl, diethylamino-ethyl, butylaminoethyl, benzyl, and tetrahydrofurfuryl), and vinyl aryl ether (the aryl group includes, for example, phenyl, tolyl, chlorophenyl, 2,4-dichloro-phenyl, naphthyl, and anthranyl);

vinyl esters such as vinyl butylate, vinyl isobutylate, vinyl trimethylacetate, vinyl diethyl-acetate, vinyl barate, vinyl caproate, vinyl chloro-acetate, vinyl dichloroacetate, vinyl methoxyacetate, vinyl butoxyacetate, vinyl phenylacetate, vinyl aceto-acetate, vinyl lactate, vinyl-b-phenylbutylate, vinyl cyclohexylcarboxylate, vinyl benzoate, vinyl salicylate, vinyl chloroabenzotate, vinyl tetrachlorobenzoate, and vinyl naphthoate;

styrenes such as styrene, alkylstyrene (for example, methylstyrene, dimethylstyrene, trimethyl-styrene, ethylstyrene, diethylstyrene, isopropylstyrene, butylstyrene, hexylstyrene, cyclohexystyrene, decyl-styrene, benzylstyrene, chloromethylstyrene, trifluoro-methylstyrene, ethoxymethylstyrene, and acetoxymethyl-styrene), alkoxystyrene (for example, methoxystyrene, 4-methoxy-3-methylstyrene, and dimethoxystyrene), and halogenostyrene (for example, chlorostyrene, dichloro-styrene, trichlorostyrene, tetrachlorostyrene, penta-chlorostyrene, bromostyrene, dibromostyrene, iodo-styrene, fluorostyrene, trifluorostyrene, 2-bromo-4-trifluoromethylstyrene, and 4-fluoro-3-trifluoromethyl-styrene);

crotonates such as alkyl crotonate (for example, butyl crotonate, hexyl crotonate, and glycerine monocrotonate);

dialkyl itaconates (for example, dimethyl itaconate, diethyl itaconate, and dibutyl itaconate);

dialkyl maleates or fumarates (for example, dimethyl maleate and dibutyl fumarate); and (metha)acrylonitrile.

There can be used as well a novolak type phenol resin, for example, a phenol novolak resin, a cresol novolak resin, and a halogenated phenol novolak resin. More specifically, it includes, for example, the methacrylic acid copolymers, the acrylic acid copolymers, the itaconic acid copoymers, the crotonic acid copolymers, the maleic acid copolymers, and partially esterified maleic acid copolymers each described in, for example, JP-B-59-44615 (the term "JP-B" as used herein means an examined Japanese patent publication), JP-B-54-34327, JP-B-58-12577, and JP-B-54-25957, JP-A-59-53836, JP-A-59-71048, JP-A-60-159743, JP-A-60-258539, JP-A-1-152449, JP-A-2-199403, and JP-A-2-199404, and further a cellulose derivative having a carboxyl group on a side chain can be enumerat-ed, and particularly preferred are a copolymer of benzyl (metha)acrylate and (metha)acrylic acid and a polyphyletic copolymer of benzyl (metha)-acrylate, (metha)acrylic acid and the other monomers, described in U.S. Patent 4,139,391, JP-B-59-44615, and JP-A-60-159743 and JP-A-60-258539.

A weight-average molecular weight of these high molecular binders is preferably 3,000 to 1,000,000, more preferably 5,000 to 400,000. A copolymer having the weight-average molecular weight less than 3,000 is difficult to manufacture, and that having the weight-average molecular weight exceeding 1,000,000 not only deteriorates an alkali developing performance in a light-sensitive layer but degrades a developing solution resistance. That is, since an inferior alkali developing performance leads to dipping in a developing solution for a long time and therefore an exposed part is liable to swell as well, an image of an excellent quality can not be obtained.

These high molecular compounds may be used singly or as a mixture of two or more kinds. A content of the light-sensitive resin composition is preferably 10 to 95 weight %, more preferably 15 to 90 weight % based on the whole solid matters. The content less than 10 weight % increases an adhesiveness of the light-sensitive resin composition too much, and that exceeding 95 weight % deteriorates a strength of an image formed and a photosensitivity.

Compounds resulting from converting at least one hydroxyl group of UV absorbers containing at least one hydroxyl group in the molecule into a functional group which is convertible into a hydroxyl group by treatment with an aqueous alkali solution and/or by heating are particularly preferred as the compounds for use in the present invention which substantially do not absorb light in about 280–450 nm region, that is, which are not hindrance in exposure to UV radiation, and which, when subjected to treatment with an aqueous alkali solution and/or to heating, are capable of absorbing light in said region, that is, which are able to screen UV radiation used for exposure, and further which have substantially no absorption in the visible region. Examples of these compounds include the compounds with a partial structure represented by formulas (I), (II), (III) or (IV) shown below.

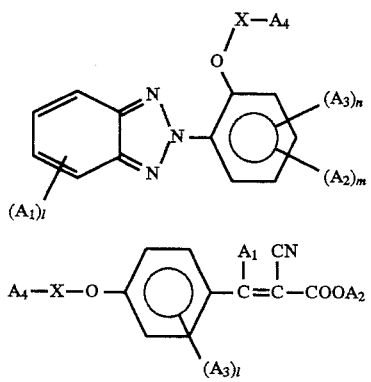

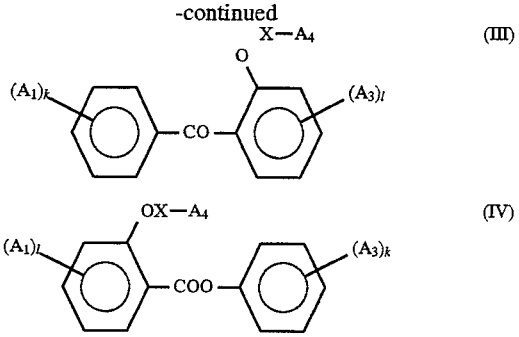

wherein X represents a protective group capable of being split off; $A_1$ to $A_4$ each represents a substituent or a linkage group, may take a structure in which two or more partial structures of Formula (I), (II), (III) or (IV) are linked via at least one of $A_1$ to A4; 1 represents an integer of 0 or 1 to 4; n and m each represents an integer of 0 or 1 to 4, provided that n+m is an integer of 0 or 1 to 4; and k represents an integer of 0 or 1 to 5.

X is not specifically limited as long as it is a group capable of being split off to be converted to H, and there can be enumerated, for example, —CO—, —OCO—, —SO$_2$—, —CONH—, —COCO—, and a benzyl group and an allyl group substituted with a nitro group or an alkoxy group in a status of X-A$_4$. Means such as a hydrolysis with an aqueous alkali, light and heat can be utilized to convert X, which is a protective group, to H. The hydrolysis with the aqueous alkali in a development or a combined use thereof with after-heating is particularly preferred from a viewpoint of an image formation performance and storing stability.

More specifically, examples of these compounds include the compounds represented by the following Formulas (V)–(XIII):

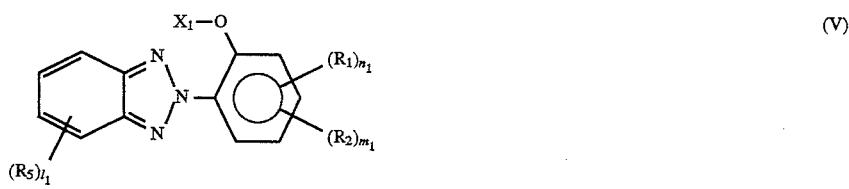

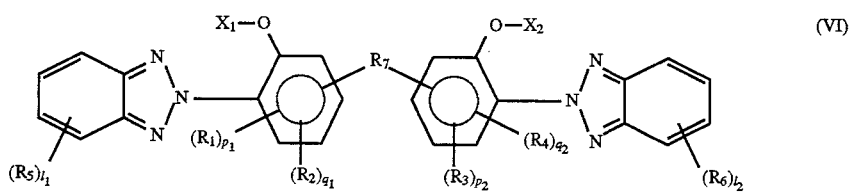

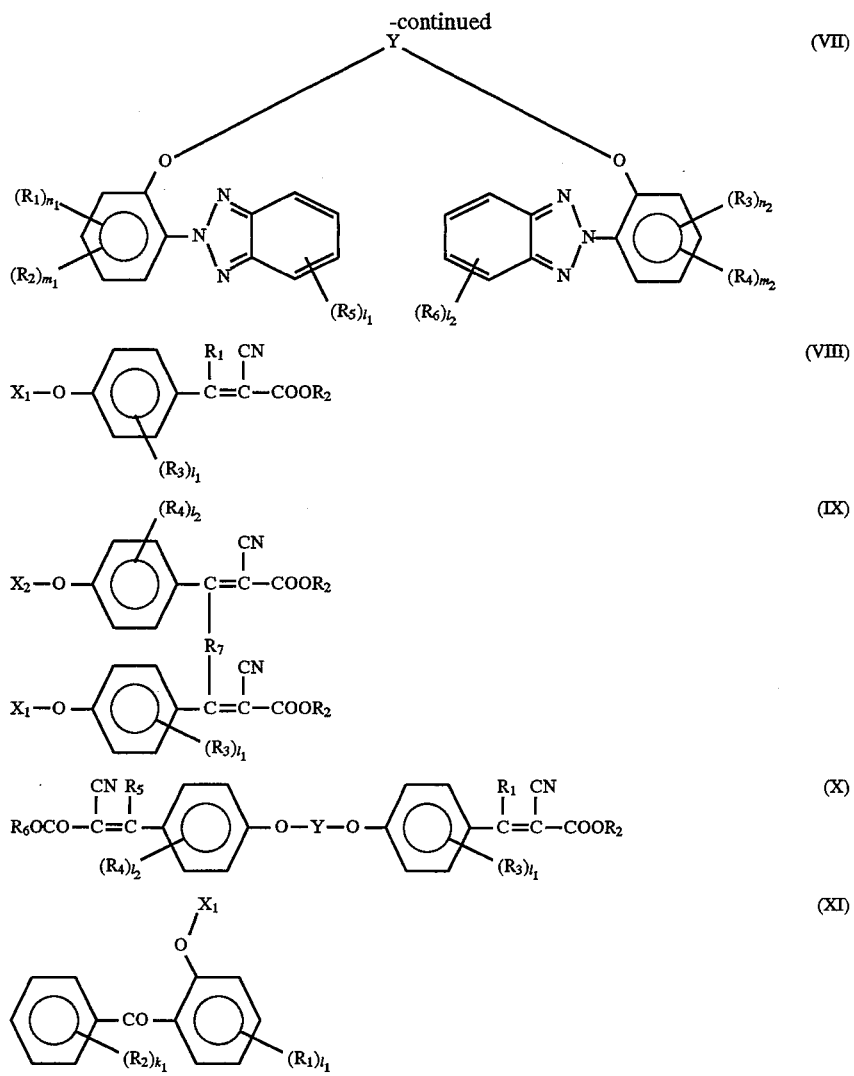

wherein $X_1$ and $X_2$ each represents a protective group capable of being split off; Y represents a divalent linkage group capable of being split off; $R_1$ to $R_6$ each represents a substituent; $R_7$ represents a divalent linkage group; $l_1$ and $l_2$ each represents an integer of 0 or 1 to 4; $n_1$, $n_2$, $m_1$ and $m_2$ each represents an integer of 0 or 1 to 4, provided that $n_1+m_1$ and $n_2+m_2$ each is an integer of 0 or 1 to 4; and $p_1$, $p_2$, $q_1$ and $q_2$ each represents an integer of 0 or 1 to 3, provided that $p_1+q_1$ and $p_2+q_2$ each is an integer of 0 or 1 to 3; and $k_1$ and $k_2$ each represents an integer of 0 or 1 to 5.

Examples of $X_1$ and $X_2$ include an acyl group such as acetyl, ethylcarbonyl, propylcarbonyl, butylcarbonyl, chloroacetyl, dichloroacetyl, trichloroacetyl, bromo-acetyl, dibromoacetyl, tribromoacetyl, fluoromoacetyl, difluoromoacetyl, trifluoromoacetyl, phenylacetyl, tolylacetyl, methoxyphenylacetyl, naphthylacetyl, benzoyl, methylbenzoyl, bromobenzoyl, p-(2-benzoxazole)-benzoyl, p-(2-benzimidazole)benzoyl, p-(2-benzo-triazole)benzoyl, acryloyl, methacryloyl, cinnamoyl, acetoacetyl, 2-carboxyethyl, 2-carboxyethenyl, o-carboxybenzoyl, and 2-carboxycyclohexyl;

a group forming carbonate together with an O atom, such as methoxy-carbonyl, ethoxycarbonyl, penoxycarbonyl, benzyloxy-carbonyl, nitropenoxycarbonyl, and 2,2,2-trichloro-ethoxycarbonyl;

a group forming sulfonate together with an O atom, such as methylsulfonyl, ethylsulfonyl, benzenesulfonyl, and tolenesulfonyl;

a group forming a urethane bond together with an O atom, such as methyl-aminocarbonyl, ethylaminocarbonyl, phenylaminocarbonyl, tolylaminocarbonyl, and 2-methacryloyloxyethylamino-carbonyl; and, in addition thereto, ethoxyoxalyl, benzoyl-carbonyl, methoxybenzyl, dimethoxybenzyl, nitrobenzyl, methoxybenzoylmethyl, and allyl ether.

Examples of Y include CO—Q—CO, COO—Q—OCO, $SO_2$—Q—$SO_2$, and CONH—Q—NHCO.

Specific examples of Q include alkylene and branched alkylene such as methylene, ethylene, trimethylene, tetramethylene, decamethylene, methylmethylene, cyclohexylmethylene, cyclohexylene, and trimethylhexamethylene; phenylene, toluylene, xylylene, arylene of the following formula, aralkylene, and a heterocycle. Further, those obtained by inserting ether (including polyethylene glycol and polypropylene glycol), CO, and COO thereinto can be utilized as well.

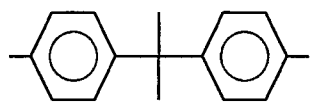

-continued

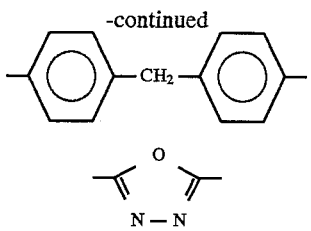

-continued

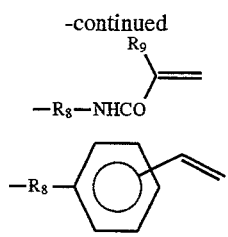

Xylylene having an aromatic group substituted with an alkoxy group or a nitro group can be utilized as other examples of Y.

On the other hand, various arbitrary substituents can be selected as $R_1$ to $R_6$, and there can be utilized, for example, methyl, ethyl, n-propyl, iso-propyl, n-butyl, iso-butyl, t-butyl, t-pentyl, t-hexyl, cyclohexyl, allyl, 1-methyl-1-phenylethyl, chloromethyl, bromomethyl, dibromomethyl, chloroethyl, bromoethyl, dichloromethyl, trichloromethyl, vinyl, fluoro, chloro, bromo, carboxy, hydroxy, hydroxyethyl, methoxy, ethoxy, allyoxy, 2-methoxycarbonylethyl, 2-(2'-ethoxyethoxy-carbonyl) ethyl, 2-carboxyethyl, 1-acetoxyvinyl, formyl, carboxyl, amino, alkylamino, dialkylamino, phenyl, acryloyloxy, methacryloyloxy, acetoamino, acetyl, methyl substituted with a cyclohexenedicarboxylic imide ring, and a group represented by the following formula.

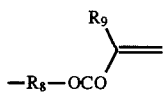

wherein $R_8$ represents a single bond, alkylene or aralkylene, in which ether (including polyethylene glycol and polypropylene glycol), CO and COOH may be inserted. More specifically, $R_8$ represents alkylene or branched alkylene such as methylene, ethylene, trimethylene, tetramethylene, decamethylene, methymethylene, cyclohexylmethylene, cyclohexylene, dimethylmethylene, ethylmethylene, dodecylmethylene, and trimethylhexamethylene; arylene and aralkylene such as phenylene, toluylene and xylylene; and polyether such diethylene glycol, dipropylene glycol, ditetramethylene glycol, triethylene glycol, tripropylene glycol and tritetramethylene glycol; and $R_9$ represents a hydrogen atom or methyl.

Examples of $R_7$ include alkylene and branched alkylene such as methylene, methylmethylene, dimethylmethylene, ethylmethylene, dodecylmethylene, cyclohexylmethylene, cyclohexylene, and trimethylhexamethylene; and arylene and aralkylene such as phenylene and xylylene. Further, those obtained by inserting ether (including polyethylene glycol and polypropylene glycol), CO, and COO thereinto can be utilized as well.

Specific examples of the compounds include the following compounds:

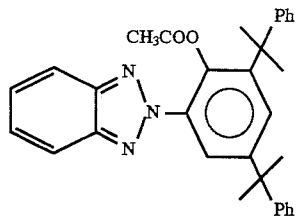

(1)

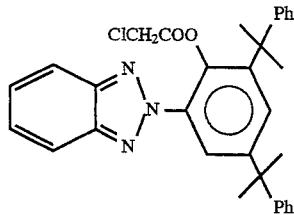

(2)

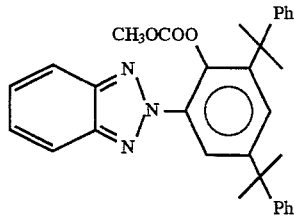

(3)

-continued
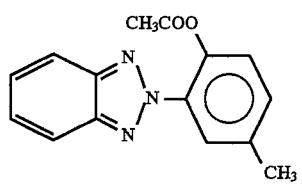 (4)
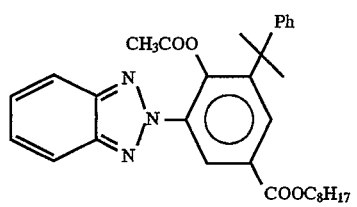 (5)
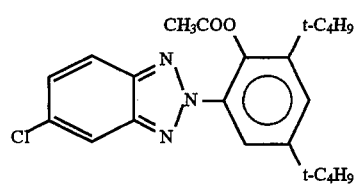 (6)
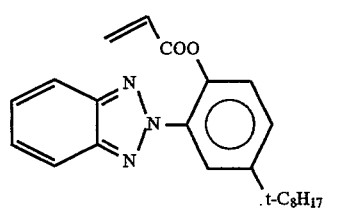 (7)
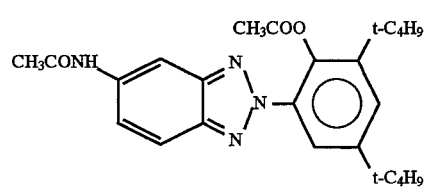 (8)
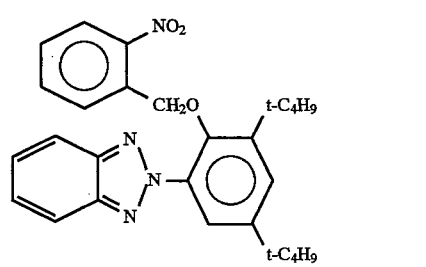 (9)
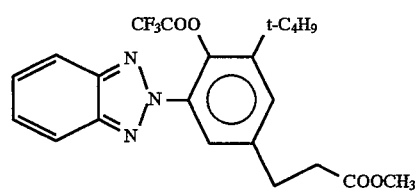 (10)
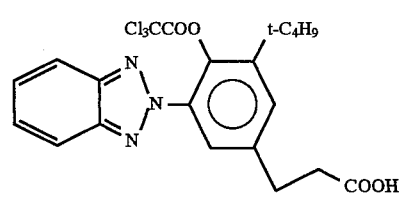 (11)

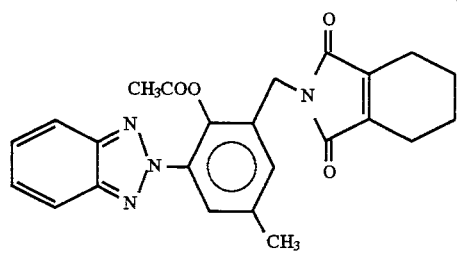
(12)
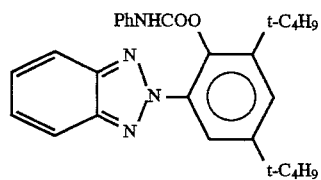
(13)
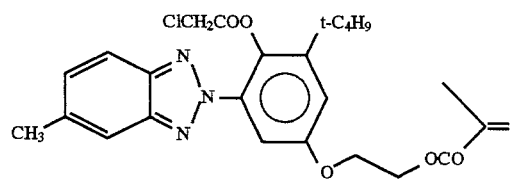
(14)
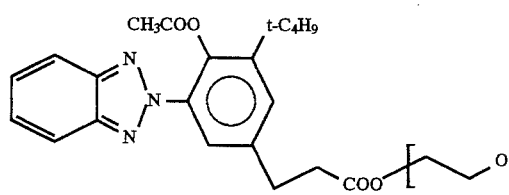
(15)
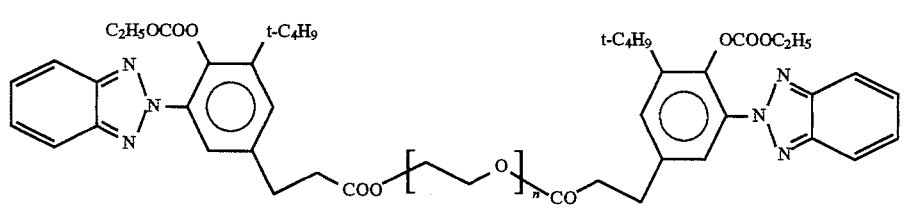
(16)
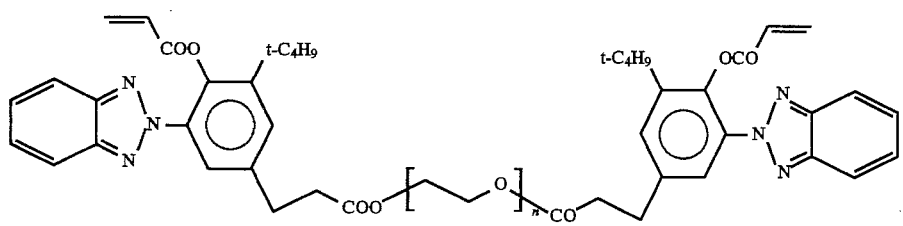
(17)
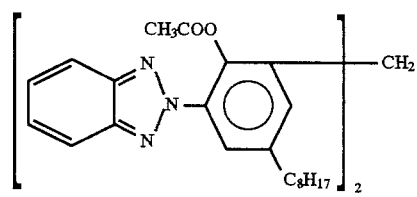
(18)
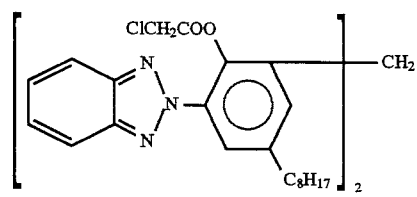
(19)

-continued
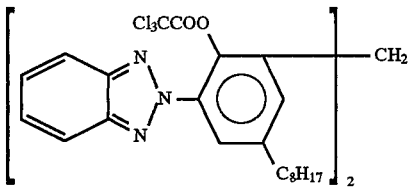 (20)
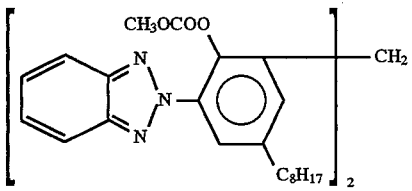 (21)
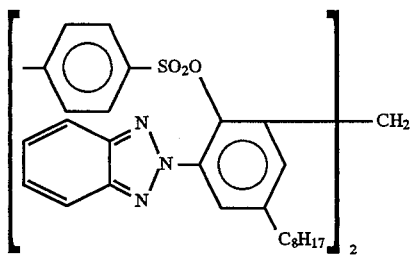 (22)
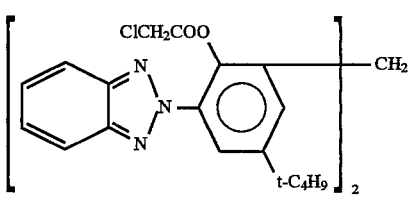 (23)
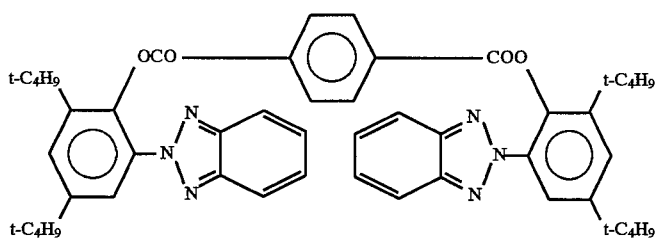 (24)
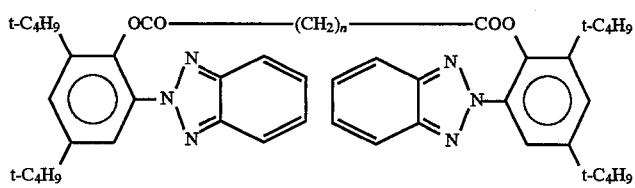 (25)
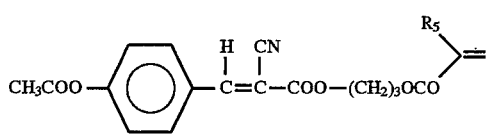 (26)
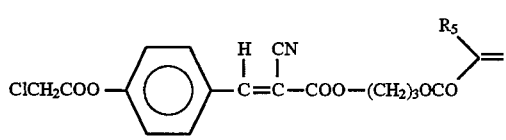 (27)
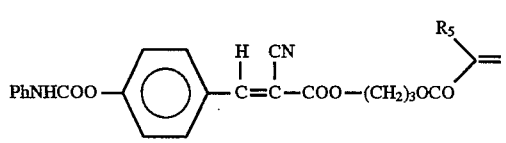 (28)

-continued

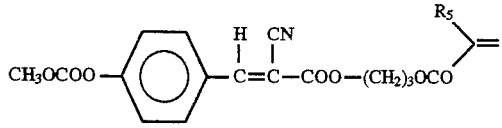 (29)

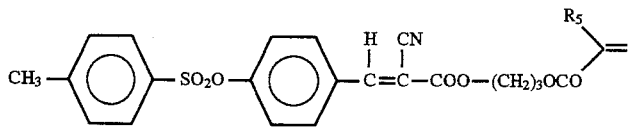 (30)

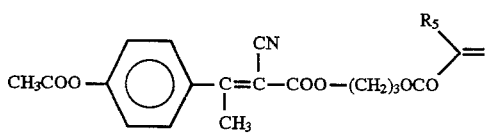 (31)

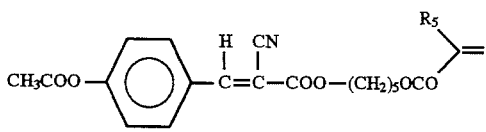 (32)

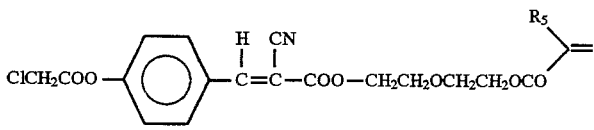 (33)

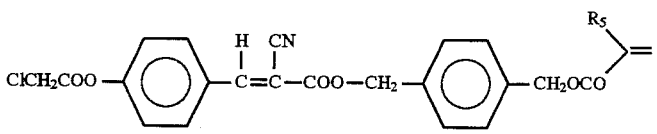 (34)

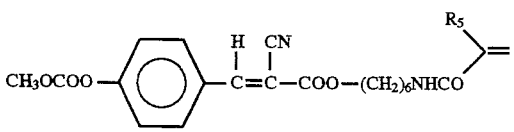 (35)

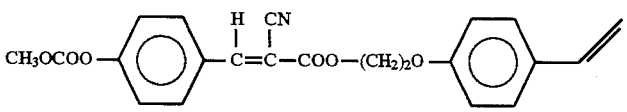 (36)

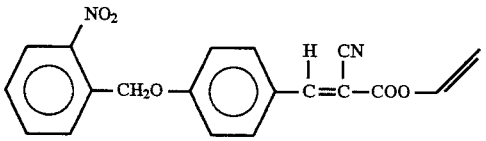 (37)

These compounds can be obtained by converting at least one hydroxyl group of, for for example, various commercially available UV absorbers containing at least one hydroxyl group in the molecule into an OR group. It is particularly preferred for these UV absorbers containing at least one hydroxyl group in the molecule to have a molecular weight of 300 or more or a polymerizable double bond in the molecule from a viewpoint of preventing the UV absorbers from volatilizing.

Examples of commercially available compounds which can be used include Tinuvin 109, Tinuvin 234, Tinuvin 213, Tinuvin 320, Tinuvin 326, Tinuvin 327, Tinuvin 340, and Tinuvin 1130 (all manufactured by Ciba Geigy Co., Ltd.), Sumisorb 250 (manufactured by Sumitomo Chemical Ind. Co., Ltd.), Cyasorb UV 5411 (manufactured by American Cyanamide Co., Ltd.), Cisorb 702 and Cisorb 704 (all manufactured by Cipro Chemicals Co., Ltd.), Adekastab LA-31 (manufactured by Asahi Denka Co., Ltd.), and Mark LA-31 (manufactured by Adeka Argas Co., Ltd.).

The compounds according to the present invention can be obtained by reacting the above compounds with halide such as acid halide, sulfonyl halide, halogenated formate, and active halide in a conventional suitable solvent and in the presence of a base catalyst. The use amounts thereof are preferably 1 to 3 equivalent for halide and 1 to 3 equivalent for the base catalyst based on at least one hydroxy group of the UV absorbers containing at least one hydroxyl group in the molecule. A reaction temperature is preferably −10° C. to 40° C.

Suitable examples of solvents include acetonitrile, chloroform, dichloromethane, carbon tetrachloride, tetrahydrofuran, dioxane, diethyl ether, acetone, benzene, and toluene.

Examples of the base catalysts which can be used include organic amines such as triethylamine, N,N-dimethylaniline, pyridine, and dimethylamino-pyridine, and sodium hydroxide, sodium acetate, and sodium hydride.

Further, they can be obtained by a dehydration reaction of a hydroxy group in an ultraviolet absorber containing a hydroxyl group in the molecule with carboxylic acid or an addition reaction of the hydroxy group with isocyanates, acid anhydrides or diketene.

These compounds may be used singly or as a mixture of two or more kinds. The content thereof in the solid matters of the light-sensitive resin composition is preferably 1 to 50 weight %, more preferably 2 to 30 weight %. The content less than 1 weight % can not reveal a sufficient UV absorbance and that exceeding 50 weight % deteriorates a developing performance.

Further, a coloring material such as a pigment and a dye can be incorporated into the composition of the present invention according to necessity. All pigments are uniformly dispersed in the light-sensitive resin composition, and they have to have a particle size of 5 μm or less, particularly preferably 1 μm or less. In preparing a color filter, the pigment has preferably the particle size of 0.5 μm or less.

Examples of preferred pigments or dyes include: Victoria Pure Blue BO (C.I. 42595), auramine (C.I. 41000), Fat Black HB (C.I. 26150), Monolite Yellow GT (C.I. Pigment Yellow 12), Permanent Yellow GR (C.I. Pigment Yellow 17), Permanent Yellow HR (C.I. Pigment Yellow 83), Permanent Carmine FBB (C.I. Pigment Red 146), Hoster Barmlet ESB (C.I. Pigment Violet 19), Permanent Ruby FBH (C.I. Pigment Red 11), Fastel Pink B Spura (C.I. Pigment Red 81), Monastral Fast Blue (C.I. Pigment Blue 15), Monolite Fast Black (C.I. Pigment Black 1), and carbon (Mitsubishi Carbon Black MA-100 and Mitsubishi Carbon Black #40).

Further, there can be enumerated as the pigment suitable for preparing a color filter, C.I. Pigment Red 97, C.I. Pigment Red 122, C.I. Pigment Red 149, C.I. Pigment Red 168, C.I. Pigment Red 177, C.I. Pigment Red 180, C.I. Pigment Red 192, C.I. Pigment Red 215, C.I. Pigment Green 7, C.I. Pigment Green 36, C.I. Pigment Blue 15:1, C.I. Pigment Blue 15:4, C.I. Pigment Blue 15:6, C.I. Pigment Blue 22, C.I. Pigment Blue 60, and C.I. Pigment Blue 64.

The pigments or dyes of yellow, magenta, cyan and black colors are used for a color display of a meter panel for an automobile, and in addition thereto, metal powder, a white pigment, and a fluorescent pigment are used as well. The preferred examples thereof will be shown below. There can be enumerated as the pigment, #1201 Lionol Yellow (C.I. 21090), Lionol Yellow GRO (C.I. 21090), Shimura Fast Yellow 8GF (C.I. 21105), Benzidine Yellow 4T-564D (C.I. 21095), Shimura Fast Red 4015 (C.I. 12355), Lionol Red 7B4401 (C.I. 15850), Fastogen Blue TGR-L (C.I. 74160), Lionol Blue SM (C.I. 26150), Mitsubishi Carbon Black MA-100, and Mitsubishi Carbon Black #40. There can be enumerated as the dye, Victoria Pure Blue (C.I. 42595), auramine O (C.I. 41000), Carotene Brilliant Flavin (C.I. basic 13), Rhodamine 6GCP (C.I. 45160), Rhodmine B (C.I. 45170), Safranine OK 70:100 (C.I. 50240), Erio Glaucine X (C.I. 42080), and Fast Black HB (C.I. 26150).

These pigments or dyes may be used singly or a mixture of two or more kinds. The content thereof in the solid matters of the light-sensitive resin composition is preferably 1 to 60 weight %, more preferably 2 to 50 weight %.

Further, there can be incorporated into the composition of the present invention according to necessity, publicly known additives, for example, a plasticizer, a filler, a stabilizer, a polymerization inhibitor, a surface active agent, a solvent, and an adhesion accelerator.

The light-sensitive resin composition of the present invention is suitable for, for example, a forming material for a color filter. That is, the coloring matters, dyes and pigments of red, green and blue colors are added to the light-sensitive resin composition of the present invention to provide a light-sensitive resin composition layer of any color on a transparent substrate, and then it is subjected to the processes such as exposing, developing, and according to necessity, heating to form an image. The development is carried out by washing out a part which is not polymerized with a suitable alkali developing solution. This process is repeated to form the image having plural colors.

In the light-sensitive resin composition of the present invention, with a process in which at least one or more picture elements are formed on a transparent substrate and then an exposure is given from a side of the transparent substrate, on which the above picture elements are not formed, the above picture elements can be utilized as a light-shielding mask. In this case, for example, in the case where an overall exposure is given, a position adjustment of a mask gets unnecessary and a concern on a position slippage thereof is removed. And, it is possible to cure all of the part on which the above picture elements are not formed. Further, in this case, it is possible as well to develop and remove a part of the portion on which the above picture elements are not formed by using partially a light-shielding mask.

Since in either case, no gap is formed between the picture elements which are formed formerly and those which are formed later, the composition of the present invention is suitable for, for example, a forming material for a color filter. To be concrete, the coloring matters, dyes and pigments of red, green and blue colors are added to the light-sensitive resin composition of the present invention, and the processes for forming an image are repeated to form the picture elements of red, green and blue colors. Then, the light-sensitive resin composition to which, for example, the black coloring materials, dyes and pigments are added is provided on an overall face. An overall exposure (or a partial exposure via a light-shielding mask) can be provided thereon to form the picture elements of a black color all over the spaces (or all but a partial region of the light-shielding mask) between the picture elements of red, green and blue colors.

In addition to a process in which the light-sensitive resin composition is coated on a substrate and dried, the light-sensitive resin composition of the present invention can be used as well for a layer transfer material. That is, the light-sensitive resin composition is layerwise provided directly on a temporary support, preferably on a polyethylene terephthalate film, or on a polyethylene terephthalate film on which an oxygen-shielding layer and a peeling layer or the peeling layer and the oxygen-shielding layer are provided. Usually, a removable cover sheet made of a synthetic resin is laminated thereon for a protection in handling. Further, there can be applied as well a layer structure in which an alkali soluble thermoplastic resin layer and an intermediate layer are provided on a temporary support and further a light-sensitive resin composition layer is provided thereon (JP-A-5-173320).

The above cover sheet is removed in use and the light-sensitive resin composition layer is laminated on a permanent support. Subsequently, peeling is carried out between those layer and a temporary support when an oxygen-shielding layer and a peeling layer are provided, between the peeling layer and the oxygen-shielding layer when the peeling layer and the oxygen-shielding layer are provided, and between the temporary support and the light-sensitive resin composition layer when either the peeling layer or the oxygen-shielding layer is not provided, and the temporary support is removed.

A metal support, a metal-sticked support, glass, ceramics, and a synthetic resin film can be used as a support for a color filter. Glass and a synthetic resin film which is transparent and have an excellent dimension stability can particularly preferably be enumerated.

A thickness of the light-sensitive resin composition layer is usually 0.1 to 50 μm, particularly preferably 1 to 5 μm.

A diluted aqueous solution of an alkaline substance is used as a developing solution for the light-sensitive resin composition of the present invention, and further a solution prepared by adding a small amount of a water-miscible organic solvent thereto is included as well.

Examples of suitable alkaline materials include alkali metal hydroxides (for example, sodium hydroxide and potassium hydroxide), alkali metal carbonates (for example, sodium carbonate and potassium carbonate), alkali metal bicarbonates (for example, sodium bicarbonate and potassium bicarbonate), alkali metal silicates (for example, sodium silicate and potassium silicate), alkali metal metasilicates (for example, sodium metasilicate and potassium metasilicate), triethanolamine, diethanolamine, monoethanolamine, morpholine, tetraalkylammonium hydroxides (for example, tetramethylammonium hydroxide), or trisodium phosphate. The concetration of the alkaline substance is 0.01 to 30 weight %, and pH is preferably 8 to 14.

Suitable organic solvents which are miscible with water include methanol, ethanol, 2-propanol, 1-propanol, butanol, diacetonealcohol, ethylene glycol monomethyl ether, ethylene glycol monoethyl ether, ethylene glycol mono-n-buthyl ether, benzyl alcohol, acetone, methyl ethyl ketone, cyclohexanone, ε-caprolactone, γ-butylolactone, dimethylformamide, dimethylacetoamide, hexamethylphosphoramide, ethyl lactate, methyl lactate, ε-caprolactam, and N-metyl-pyrrolidone. A concentration of the organic solvent which is miscible with water is 0.1 to 30 weight %.

Further, a publicly known surface active agent can be added. A concentration of the surface active agent is preferably 0.01 to 10 weight %.

A developing solution can be used in a form either of a bath solution or a spraying solution. In order to remove a non-cured portion of the light-sensitive resin composition layer, there can be combined the methods such as rubbing with a rotary blush and rubbing with a wet sponge. Usually, a temperature of a developing solution is preferably at and around a room temperature to 40° C. A developing time is changeable according to a kind of the light-sensitive resin composition, an alkalinity and a temperature of the developing solution, and a kind and a concentration of an organic solvent in the case where it is added. Usually, it is 10 seconds to 2 minutes. Too short time not only leads to an insufficient development of an unexposed part but also leads to an insufficient absorbance of UV radiation, and too long time leads to etching of an exposed part as well in some cases. It is possible to put a rinsing step after a development processing.

Heat treatment is preferably carried out after a development processing. That is, a support having a layer which is photo-polymerized by exposing (hereinafter referred to as a photocured layer) is heated in an electric furnace and a drier, or the photocured layer is irradiated with an infrared lamp. A heating temperature and time depend on a composition of a polymerizable composition used and a thickness of a layer formed. In general, heating is preferably applied at about 120° to about 250° C. for about 10 to about 120 minutes.

The light-sensitive resin composition of the present invention can suitably be used for forming a color filter but will not be limited to this application. It is useful as well for a recording material to which a high degree light fastness is required, a display, a display element, paint, and printing ink.

The present invention will be explained below with reference to the examples. Unless otherwise indicated, a "part" represents a weight part and "%" represents weight %.

EXAMPLES

Synthetic Example 1

Sodium hydride (60 %) 0.24 part was gradually added to tetrahydrofuran 10 parts, and further Tinuvin 234 (manufactured by Ciba Geigy Co., Ltd., λmax=346 nm) 2.23 parts was gradually added thereto. Acetyl chloride 0.43 part was dropped thereto and stirring was applied at a room temperature for one hour. Water 100 parts was added and the solution was extracted with chloroform, followed by condensing, whereby an orange color solid substance was obtained. This was recystalized from ethyl acetate/hexane to obtain pale yellow crystal 1.5 parts of the compound (the compound of the formula (1)) obtained by protecting a hydroxy group of a 2-(2'-hydroxyphenyl)2H-benzotriazole derivative with an acetyl group. (λmax=299 nm).

Synthetic Example 2

The procedure of Synthetic Example 1 was repeated except that acetyl chloride 0.43 part was changed to chloroacetyl chloride 0.62 part, to obtain brown crystal 1.9 parts of the compound (the compound of the formula (2)) obtained by protecting a hydroxy group of the 2-(2'-hydroxyphenyl)2H-benzotriazole derivative with a chloroacetyl group. (λmax=301 nm).

Synthetic Example 3

Adekastab LA-31 (manufactured by Asahi Denka Co., Ltd., λmax=349 nm) 3.29 parts and triethylamine 1.21 part were dissolved in tetrahydrofuran 20 parts. A solution of chloroacetyl chloride 1.24 part/tetrahydrofuran 5 parts was dropped while cooling with ice. After stirring at a room temperature for further 4 hours, the solution was poured into water 100 parts and extracted with ethyl acetate, followed by condensing, whereby a yellow solid substance was obtained. This was refined with a silica gel column chromatography and recystalization (isopropyl alcohol/chloroform) to obtain yellow crystal 2.1 parts of the compound (the compound of the formula (19)) obtained by protecting a hydroxy group of the 2-(2'-hydroxyphenyl)-2H-benzotriazole derivative with a chloroacetyl group. (λmax=305 nm).

Synthetic Example 4

The procedure of Synthetic Example 3 was repeated except that chloroacetyl chloride 1.24 part was changed to methyl chloroformate 1.04 part, to obtain yellow crystal 3.7 parts of the compound (the compound of the formula (21)) obtained by protecting a hydroxy group of the 2-(2'-hydroxyphenyl)2H-benzotriazole derivative with a methyoxycarbonyl group. (λmax=304 nm).

Synthetic Example 5

The procedure of Synthetic Example 3 was repeated except that chloroacetyl chloride 1.24 part was changed to p-toluenesulfonyl chloride 2.10 parts, to obtain yellow crystal 3.4 parts of the compound (the compound of the formula (22)) obtained by protecting a hydroxy group of the 2-(2'-hydroxyphenyl)2H-benzotriazole derivative with a toluenesulfonyl group. ($\lambda$max=301 nm).

Synthetic Example 6

Adekastab LA-31 (manufactured by Asahi Denka Co., Ltd., $\lambda$max=349 nm) 13.2 parts and pyridine 3.5 parts were dissolved in tetrahydrofuran 20 parts. A solution of chloroacetyl chloride 9.1 parts/tetrahydrofuran 10 parts was dropped thereto while cooling with ice. After stirring at a room temperature for further 4 hours, deposited inorganic salt was removed and the solvent was condensed for drying, to obtain a yellowish brown solid substance. This was refined by recrystallization (isopropyl alcohol/chloroform) to obtain colorless crystal 6.6 parts of the compound (the compound of the formula (20)) obtained by protecting a hydroxy group of the 2-(2'-hydroxyphenyl)-2H-benzotriazole derivative with a trichloroacetyl group. ($\lambda$max=305 nm).

Synthetic Example 7

Tinuvin 1130 (manufactured by Ciba Geigy Co., Ltd., $\lambda$max=345 nm) 11.3 parts and triethylamine 4.37 parts were dissolved in acetonitrile 20 parts. A solution of acetyl chloride 3.77 parts/acetonitrile 10 parts was dropped thereto while cooling with ice. After stirring at a room temperature for further 4 hours, the solution was poured into water 200 parts and extracted with chloroform, followed by condensing, whereby a brown oily substance was obtained. This was refined with an active carbon treatment and a silica gel column chromatography (chloroform/methanol) to thereby obtain a brown oily substance 13.7 parts of the compound (the compound of the formula (15)) obtained by protecting a hydroxy group of the 2-(2'-hydroxyphenyl)-2H-benzotriazole derivative with an acetyl group. ($\lambda$max=300 nm).

Synthetic Example 8

2-(2'-Hydroxy-5-methylphenyl)2H-benzotriazole (Tinuvin P manufactured by Ciba Geigy Co., Ltd., $\lambda$max=336 nm) 1.13 part and triethylamine 0.61 part were dissolved in acetonitrile 20 parts. A solution of acetyl chloride 0.43 part/acetonitrile 10 parts was dropped thereto while cooling with ice. After stirring at a room temperature for further 4 hours, the solution was poured into water 200 parts and extracted with chloroform, followed by condensing and refining with recrystallization (isopropyl alcohol/chloroform). A pale yellow crystal 0.9 part of 2-(2'-acetoxy-5-methylphenyl)2H-benzotriazole was obtained. ($\lambda$max=298 nm).

Synthetic Example 9 p-Hydroxy-$\alpha$-cyanocinnamic acid-3-methacryloyloxypropyl ester 1.58 part and triethylamine 0.71 part were dissolved in acetonitrile 15 parts. An acetonitrile solution 2 parts of acetyl chloride 0.47 part was dropped thereto while cooling with ice and stirring was applied at a room temperature for one hour. The reaction solution was poured into water 100 parts and deposited crystal was filtered off, followed by washing with water and drying. This was recrystallized from ethyl acetate/hexane. There was obtained colorless crystal 1.2 part of the compound (the compound of formula (26), wherein $R_5$ is a methyl group) obtained by protecting a hydroxy group of p-hydroxy-$\alpha$-cyanocinnamic acid-3-methacryloyloxy-propyl ester with an acetyl group. ($\lambda$max=309 nm)

Synthetic Example 10

The procedure of Synthetic Example 9 was repeated except that acetyl chloride 0.47 part was changed to chloroacetyl chloride 0.68 part, and recrystallization from isopropyl alcohol was carried out to obtain colorless crystal 1.2 part of the compound (the compound of formula (27), wherein $R_5$ is a methyl group) obtained by protecting a hydroxy group of p-hydroxy-$\alpha$-cyanocinnamic acid-3-methacryloyloxy-propyl ester with a chloroacetyl group. ($\lambda$max=306 nm).

Synthetic Example 11

The procedure of Synthetic Example 9 was repeated except that acetyl chloride 0.47 part was changed to p-toluenesulfonyl chloride 1.14 part, and refinery was carried out with a silica gel column chromatography (a spreading solvent was ethyl acetate(1)/hexane(3)) to obtain pale yellow crystal 1.9 part of the compound (the compound of formula (30), wherein $R_5$ is a methyl group) obtained by protecting a hydroxy group of p-hydroxy-$\alpha$-cyanocinnamic acid-3-methacryloyloxy-propyl ester with a p-toluenesulfonyl group. ($\lambda$max=303 nm).

Example 1

A light-sensitive coating solution comprising the following composition C was applied and dried on a glass substrate having a thickness of 1.1 mm with a spin coater so that a dry thickness became 2 µm.

| Composition C: | |
|---|---|
| Benzyl methacrylate/methacrylic acid copolymer (copolymerization composition ratio = 73/27, viscosity = 0.12) | 60 parts |
| Pentaerythritol tetraacrylate | 43.2 parts |
| Michler's ketone | 2.4 parts |
| 2-(o-Chlorophenyl)-4,5-diphenyl-imidazole dimer | 2.5 parts |
| Compound of Synthetic Example 1 | 15.0 parts |
| Ethylene glycol monomethyl ether acetate | 560 parts |
| Methyl ethyl ketone | 280 parts |

Further, a coating solution comprising the following composition. D was applied and dried on the above light-sensitive layer with a spin coater so that a dry thickness became 1.5 µm.

| Composition D: | |
|---|---|
| Polyvinyl alcohol (VA 205 manufactured by Kuraray Co., Ltd., saponification rate = 80%) | 130 parts |
| Polyvinylpyrrolidone (PVP K-90 manufactured by GAF Corporation) | 60 parts |
| Fluorine series surface active agent (Surflon S-131 manufactured by Asahi Glass Co., Ltd.) | 10 parts |
| Distilled water | 3350 parts |

The sample thus obtained was exposed with an exposure equipment having a 2 KW high pressure mercury lamp via a prescribed photomask in an exposure of 50 mj/cm$^2$ and then was subjected to a spray development in a 1:10 mixed aqueous solution of CD (the brand name of a developing solution manufactured by Fuji Hunt Electronics Technology Co., Ltd.) and water to remove an unnecessary portion to form picture element pattern on a glass substrate.

Then, the sample was subjected to a heat treatment at 220° C. for 20 minutes to prepare as well the sample in which the picture element pattern was completely cured.

Reference Example 1

The procedure of Example 1 was repeated except that a light-sensitive coating solution composition to which the compound of Synthetic Example 1 was not added was used, whereby a picture element pattern was formed on a glass substrate.

Evaluation:

The sample obtained above was used to subject it to the following evaluation.
(1) Absorbance at 365 nm before a heat treatment (the sample of Reference Example 1 was used as a reference).
(2) Absorbance at 365 nm after the heat treatment (the sample of Reference Example 1 was used as a reference).
(3) Presence of an image underetch (cutting off at a lower part of a relief image).

The results are summarized in Table 1.

Examples 2 to 11 and Comparative Examples 1 to 4

The same procedure as that of Example 1 was repeated except that the compounds of Synthetic Examples 2 to 11 were used for the examples of the invention in place of the compound of Synthetic Example 1 and Tunivin 234 and 1130 (a benzotriazole series UV absorber) manufactured by Ciba Geigy Co., Ltd., A dekastab LA-31 manufactured by Asahi Denka Co., Ltd. and p-hydroxy-α-cyanocinnamic acid-3-methacryloyloxypropyl ester were used for the comparative examples in the light-sensitive coating solution in equal amounts, to form the picture element patterns on the glass substrates.

The results are summarized in Table 1.

TABLE 1

Evaluation of the light-sensitive resin composition

| No. | Compound used | Absorbance in 365 nm Before heat treatment | After heat treatment | Presence of under etch |
|---|---|---|---|---|
| Example 1 | Compound of SE-1*[1] | 0 | 0.3 | None |
| Example 2 | Compound of SE-2 | 0 | 0.4 | None |
| Example 3 | Compound of SE-3 | 0 | 0.5 | None |
| Example 4 | Compound of SE-4 | 0 | 0.4 | None |
| Example 5 | Compound of SE-5 | 0 | 0.4 | None |
| Example 6 | Compound of SE-6 | 0 | 0.7 | None |
| Example 7 | Compound of SE-7 | 0 | 0.4 | None |
| Example 8 | Compound of SE-8 | 0 | 0.25 | None |
| Example 9 | Compound of SE-9 | 0 | 0.3 | None |
| Example 10 | Compound of SE-10 | 0 | 0.5 | None |
| Example 11 | Compound of SE-11 | 0 | 0.4 | None |
| Compara. Example 1 | Tinuvin 234 | 0.5 | 0 | Presence |
| Compara. Example 2 | Tinuvin 1130 | 0.5 | 0 | Presence |
| Compara. Example 3 | LA-31 | 0.7 | 0.15 | Presence |
| Compara. Example 4 | *[2] | 0.5 | 0 | Presence |

*[1]SE: Synthetic Example.
*[2]P-Hydroxy-α-cyanocinnamic acid-3-methacryloyloxypropyl ester In Examples 1 to 11, no underetch was found and an image having an excellent image profile and a good UV shielding performance was formed.

In Comparative Examples 1 to 4, since an absorbance at 365 nm was large in exposing, light did not reach the depth of a layer and lack of photocuring was generated. That resulted in generating underetch to a large extent and forming an image profile of an upside-down trapezoid.

Example 12

The coating solution having the following composition H1 was applied to a polyethylene terephthalate film temporary support with a thickness of 100 μm and was dried, to provide a thermoplastic resin layer having a dry thickness of 20 μm.

| Thermoplastic resin layer composition H1: | |
|---|---|
| Methyl methacrylate/2-ethylhexyl acrylate/ benzylmethacrylate/methacrylic acid copolymer (copolymer composition ratio (mole ratio) = 55/11.7/4.5/28.8, weight average molecular weight = 90000) | 15 parts |
| Polypropylene glycol diacrylate (average molecular weight = 822) | 6.5 parts |
| Tetraethylene glycol dimethacrylate | 1.5 part |
| p-Toluenesulfonamide | 0.5 part |
| Bnezophenone | 1.0 part |
| Methyl ethyl ketone | 30 parts |

Next, the coating solution having the composition B1 described below was applied to the above thermoplastic resin layer and dried, to provide a separating layer having a thickness of 1.6 μm.

| Separating layer composition B1: | |
|---|---|
| Polyvinyl alcohol (VA 205 manufactured by Kuraray Co., Ltd., saponification rate = 80%) | 130 parts |
| Polyvinylpyrrolidone (PVP K-90 manufactured by GAF Corporation) | 60 parts |
| Fluorine series surface active agent (Surflon S-131 manufactured by Asahi Glass Co., Ltd.) | 10 parts |
| Distilled water | 3350 parts |

There were coated and dried on four sheets of the temporary supports each having the thermoplastic resin layer and separating layer, the four color light-sensitive solutions of a black color (for a K layer), a red color (for an R layer), a green color (for a G layer), and a blue color (a B layer) each having the composition shown in Table 2 below, whereby a coloring light-sensitive resin layer having a dry thickness of 2 μm was formed.

TABLE 2

Composition of the light-sensitive resin composition (by part)

| | R layer | B layer | G layer | K layer |
|---|---|---|---|---|
| Benzyl methacrylate/ methacrylic acid (mole ratio = 73/27) | 7.4 | 7.4 | 7.4 | 7.4 |
| Pentaerythritol tetraacrylate | 7.0 | 7.0 | 7.0 | 7.0 |
| 6-[p-(N,N-bis(ethoxycarbonylmethyl)amino) phenyl]-2,4-bis(trichloromethyl)-s-triazine | 0.34 | 0.34 | 0.34 | 0.34 |

TABLE 2-continued

| | Composition of the light-sensitive resin composition (by part) | | | |
|---|---|---|---|---|
| | R layer | B layer | G layer | K layer |
| Hydroquinone monomethyl ether | 0.0035 | 0.0035 | 0.0035 | 0.0035 |
| Chromophthal Red A2B (red) (Pigment: Red 177) | 9.8 | — | — | — |
| Heliogen Blue L6700F (blue) (Pigment Blue 15:6) | — | 9.8 | — | — |
| Monastral Green 6Y (green) (Pigment Green 36) | — | — | 9.8 | — |
| Carbon black (black) | — | — | — | 9.8 |
| Compound of Synthetic Example 1 | 5.0 | 5.0 | 5.0 | 5.0 |
| Ethylene glycol monomethyl ether acetate | 64 | 64 | 64 | 64 |
| Methyl ethyl ketone | 97 | 97 | 97 | 97 |

Further, the covering sheets of polypropylene (thickness: 12 μm) were pressed on the above light-sensitive resin layers to prepare the red-sensitive, blue-sensitive, green-sensitive and black-sensitive transfer materials.

This light-sensitive transfer material was used to prepare a color filter by the process described below. A covering sheet of a red-sensitive transfer material was peeled off and a light-sensitive resin layer face was sticked on a soda glass substrate having a coating of silicon oxide having a thickness of 2000 Å with a laminator (VP-II manufactured by Taisei Laminator Co., Ltd.) under pressure (0.8 kg/cm$^2$) and heating (130° C.). Subsequently, the temporary support was peeled off from the thermoplastic resin layer at the interface thereof to remove the temporary support.

An exposure was given via a prescribed photomask (a size of a picture element: 40 μm×200 μm) with an aligner having a 2KW ultrahigh pressure mercury lamp at an exposure of 50 mj/cm$^2$. A spray development was carried out with a 1:10 mixed aqueous solution of CD (the brand name of Fuji Hunt Electronics Technology Co., Ltd.) and water to remove an unnecessary part, whereby a red picture element pattern was formed on a glass substrate. Thereafter, a heat treatment was provided at 220° C. for 20 minutes to completely cure the red picture element pattern.

Subsequently, a green-sensitive transfer material was sticked on the glass substrate on which the red picture element pattern was formed in the same manner as that described above, and it was subjected to peeling off, an exposure via the mask and a development, followed by carrying out the heat treatment at 220° C. for 20 minutes. A green picture element pattern was formed.

The same procedure was repeated with a blue-sensitive transfer material to form a color filter comprising R, G and B picture elements on the transparent glass substrate.

Next, a black-sensitive transfer material was sticked on the color filter thus obtained by the same process as that described above and a temporary support was peeled off. This time, an exposure (100 mj/cm$^2$) was carried out from a back face via a prescribed photomask (having a light-transmittable region which is larger than an RGB picture element region formed) with a 2 KW ultrahigh pressure mercury lamp, and a development was carried out to prepare a black matrix at a region larger than the spaces between the respective RGB picture elements and the RGB-forming regions.

The color filter having the black matrix thus obtained had no dropping of a picture element and a good adhesion to a substrate, and a residue of a black-sensitive material was not found on the respective RGB picture elements. The black matrix obtained hap an optical density of 2, and these color filters were used to prepare a liquid crystal display panel. The display contrast was sufficiently satisfactory.

Examples 13–22

The same procedure as that of Example 12 was repeated except that the compounds of Synthetic Examples 2 to 11 were added to the respective RGB light-sensitive solutions in amounts in place of the compound of Synthetic Example 1. A color filter having the black matrix thus obtained had no dropping of a picture element and a good adhesion to a substrate, and a residue of a black-sensitive material was not found on the respective RGB picture elements. The black matrix obtained had an optical density of 2, and these color filters were used to prepare a liquid crystal display panel. The display contrast was sufficiently satisfactory.

Comparative Examples 5 to 8

The same procedure as that of Example 12 was repeated except that Tinuvin 234 and 1130 manufactured by Ciba Geigy Co., Ltd., Adekastab LA-31 manufactured by Asahi Denka Co., Ltd. and p-hydroxy-α-cyanocinnamic acid-methacryloyloxypropyl ester were added to the respective RGB light-sensitive solutions in the same amounts in place of the compound of Synthetic Example 1. In a color filter having the black matrix thus obtained, a residue of the black-sensitive material was found on the respective RGB picture elements, and a spectral characteristic desired as a color filter was not obtained.

Comparative Examples 9 to 12

The same procedure as that of Comparative Examples 5 to 8 was repeated except that an exposure from the back face was changed to 10 mj/cm$^2$. In these cases, a residue of the black-sensitive material was not found on the respective RGB picture elements in a color filter having the black matrix thus obtained but the black matrix obtained had an optical density of 1 or less. These color filters were used to prepare the liquid crystal display panels in which lack of a display contrast was generated.

What is claimed is:

1. A light-sensitive resin composition containing:
   (1) a photopolymerization initiator or a photopolymerization initiator system,
   (2) an addition-polymerizable monomer having an ethylenically unsaturated double bond,
   (3) a high molecular weight binder which is soluble in an alkaline aqueous solution and insoluble in water, and
   (4) at least one of compounds having absorption in a wavelength region that has been shifted to a shorter wavelength region by converting at least one functional group of a UV absorber into another functional group which is convertible into the original functional group by being subjected to both of (A) treatment with an aqueous alkali solution and (B) heating,
   wherein said compounds do not substantially absorb light in a 330–430 nm region after said converting at least one functional group of a UV absorber into another functional group, but after converting said another functional group back into the original functional group are capable of absorbing in that region but not in the visible region.

2. The light-sensitive resin composition of claim 1, wherein said compounds (4) are precursor compounds of UV absorbers having at least one functional group which has resulted from the conversion of at least one hydroxyl group of a UV absorber containing at least one hydroxyl group and which is convertible into a hydroxyl group by being subjected to treatment with an aqueous alkali solution and heating.

3. The light-sensitive resin composition of claim 2, wherein said at least one hydroxyl group of the UV absorber containing at least one hydroxyl group has been converted into a functional group selected from the group consisting of an ester group, a carbonate group, a sulfonic acid group, a urethane group, an allyl ether group, a nitro-substituted benzyl ether group, and an alkoxy-substituted benzyl ether group.

4. The light-sensitive resin composition of claim 3, wherein said ester group is an α-keto ester group.

5. The light-sensitive resin composition of claim 2, wherein the UV absorber containing at least one hydroxyl group is a compound selected from the group consisting of a 2-(2'-hydroxyphenyl)2H-benzotriazole derivative and a p-hydroxycyanocinnamic acid derivative.

6. The light-sensitive resin composition of claim 1, wherein said composition further contains a coloring material.

7. The light-sensitive resin composition of claim 1, wherein the high molecular weight binder is a high molecular weight binder having a COOH group.

8. The light-sensitive resin composition of claim 1, wherein said compounds (4) have an absorbance at 365 nm before treatment of 0 and an absorbance at 365 nm after treatment of not less than 0.25.

* * * * *